(12) United States Patent
Chey et al.

(10) Patent No.: US 8,595,919 B2
(45) Date of Patent: Dec. 3, 2013

(54) SILICON CHICKLET PEDESTAL

(75) Inventors: S. Jay Chey, Ossining, NY (US); Timothy C. Krywanczyk, Essex Junction, VT (US); Mohammed S. Shaikh, Essex Junction, VT (US); Matthew T. Tiersch, Essex Junction, VA (US); Cornelia Kang-I Tsang, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 398 days.

(21) Appl. No.: 13/095,973

(22) Filed: Apr. 28, 2011

(65) Prior Publication Data

US 2011/0199109 A1    Aug. 18, 2011

Related U.S. Application Data

(62) Division of application No. 12/540,487, filed on Aug. 13, 2009, now Pat. No. 7,987,591.

(51) Int. Cl.
*B23P 19/00* (2006.01)

(52) U.S. Cl.
USPC ............................. 29/729; 29/738; 324/72.5

(58) Field of Classification Search
USPC .................................... 29/729, 738; 324/72.5
See application file for complete search history.

(56) References Cited

U.S. PATENT DOCUMENTS

| | | | |
|---|---|---|---|
| 5,066,907 A * | 11/1991 | Tarzwell et al. | 324/750.25 |
| 5,604,446 A * | 2/1997 | Sano | 324/754.16 |
| 6,031,382 A | 2/2000 | Nakaizumi | |
| 6,188,231 B1 | 2/2001 | Palagonia | |
| 6,426,636 B1 * | 7/2002 | Das et al. | 324/754.07 |
| 6,507,497 B2 | 1/2003 | Mashino | |
| 6,819,127 B1 | 11/2004 | Hembree | |
| 6,888,223 B2 | 5/2005 | Brouillette et al. | |
| 6,956,386 B2 | 10/2005 | Kim et al. | |
| 6,967,494 B2 | 11/2005 | Kline | |
| 6,975,127 B2 * | 12/2005 | DiOrio | 324/754.08 |
| 7,022,553 B2 | 4/2006 | Ahn et al. | |
| 7,025,891 B2 | 4/2006 | Codding et al. | |
| 2005/0253606 A1 | 11/2005 | Kim et al. | |
| 2008/0017407 A1 | 1/2008 | Kawano | |

FOREIGN PATENT DOCUMENTS

| | | |
|---|---|---|
| EP | 1847834 A1 | 2/2006 |
| JP | 2006222309 | 8/2006 |

OTHER PUBLICATIONS

Deng Chun et al.; "A MEMS Based Interposer for Nano-Wafer Level Packaging Test"; IEEE Xplore; http://ieeexplore.ieee.org/xpl/absprintf.jsp?arnumber-1271555&page=FREE; Sep. 2, 2008.

L. Criscuolo; "Using Silicon Contacts to Test and Burn-In Flash Memory, Microprocessors, and FPGAs"; IEEE Xplore; http://ieeexplore.ieee.org/xpls/absprintf.jsp?arnumber=670813; Sep. 2, 2008.

* cited by examiner

*Primary Examiner* — Carl Arbes
(74) *Attorney, Agent, or Firm* — Cantor Colburn LLP; Vazken Alexanian

(57) ABSTRACT

A silicon chicklet pedestal for use in a wafer-level test probe of a wafer is provided and includes a main body, first and second opposing faces, and an array of vias formed through the main body to extend between the first and second faces, through which pairs of leads, respectively associated with each via at the first and second faces, are electrically connectable to one another.

10 Claims, 8 Drawing Sheets

STRIP FIRST LAYER
OPERATION 190

INSULATION APPLICATION
OPERATION 200

FOURTH LAYER DEPOSITION
OPERATION 210

LINER REMOVAL
OPERATION 220

FILLING AND CURING
OPERATION 230

FORMING LEADS
OPERATION 240

SILICON CHICKLET PEDESTAL

CROSS-REFERENCE TO RELATED APPLICATION

This application is a divisional of U.S. patent application Ser. No. 12/540,487, filed Aug. 13, 2009, the disclosure of which is incorporated by reference herein in its entirety.

BACKGROUND

Aspects of the present invention are directed to a silicon chicklet pedestal and, more particularly, to a silicon chicklet pedestal for use in a wafer-level test probe.

Normally, for high-power and high-performance wafer-level tests, probes are employed to assess, among other things, operation conditions of the wafer being tested. Conventional probes include a ceramic pedestal substrate within the test hardware. Unfortunately, ceramic pedestal substrates are relatively expensive and may require a 9-12 month order lead time. Also, due to the limitations of ceramic processing at small pad size on tighter pitch, as wafer pitches shrink, ceramic pedestal substrates will not be able to maintain substrate top metallurgy registration accuracy and, as such, it is seen that conventional probes including ceramic pedestal substrates are not reliable for wafers having test pitches of less than 200 µm.

As an additional matter, is has been seen that organic substrates generally provide for more accurate footprint registration at tighter pitch. With this in mind, it has further been seen that the use of silicon, as opposed to ceramics, in the pedestal enables the creation of a pedestal on an organic substrate.

SUMMARY

In accordance with an aspect of the invention, a silicon chicklet pedestal for use in a wafer-level test probe of a wafer is provided and includes a main body, first and second opposing faces, and an array of vias formed through the main body to extend between the first and second faces, through which pairs of leads, respectively associated with each via at the first and second faces, are electrically connectable to one another.

In accordance with another aspect of the invention, a silicon chicklet pedestal is provided and includes a silicon wafer having first and second opposing faces and a main body through which an array of vias each extend between the first and the second faces, an insulating layer formed on sidewalls of each of the vias, a conductive layer formed on the insulating layer, a cured filling, including conductive material, disposed in remaining spaces in each of the vias, and a pair of leads associated with each of the vias at the first and second faces, the leads of each pair being electrically connectable by the conductive material of the associated via.

In accordance with this aspect of the invention, an apparatus for use in a wafer-level test of a wafer is provided and includes a printed circuit board (PCB) for a tester interface to control operations of the wafer-level test, a multi-layer ceramic and/or organic space transformer coupled to and in signal communication with the PCB, and the silicon chicklet pedestal interposed between and being coupled to the multi-layer ceramic and/or organic space transformer and the wafer at the first and second faces, respectively.

In accordance with an aspect of the invention, a method of forming a silicon chicklet pedestal for use in a wafer-level test probe from a silicon wafer having first and second opposing faces is provided and includes forming a first layer at the first and second faces, forming a second layer, including an array of pre-vias, on the first layer at the first face and forming a third layer on the first layer at the second face, etching an array of vias, as respective extensions of each of the pre-vias, through the first layer at the first face and through the silicon wafer, removing the first, second and third layers from the silicon wafer, introducing at least a conductive material in each of the vias, and forming a pair of leads for each of the vias at the first and second faces, the leads of each pair being electrically connectable by the conductive material of the corresponding via.

BRIEF DESCRIPTIONS OF THE SEVERAL VIEWS OF THE DRAWINGS

The subject matter regarded as the invention is particularly pointed out and distinctly claimed in the claims at the conclusion of the specification. The foregoing and other aspects, features, and advantages of the invention are apparent from the following detailed description taken in conjunction with the accompanying drawings in which:

DETAILED DESCRIPTION

Figure 1:
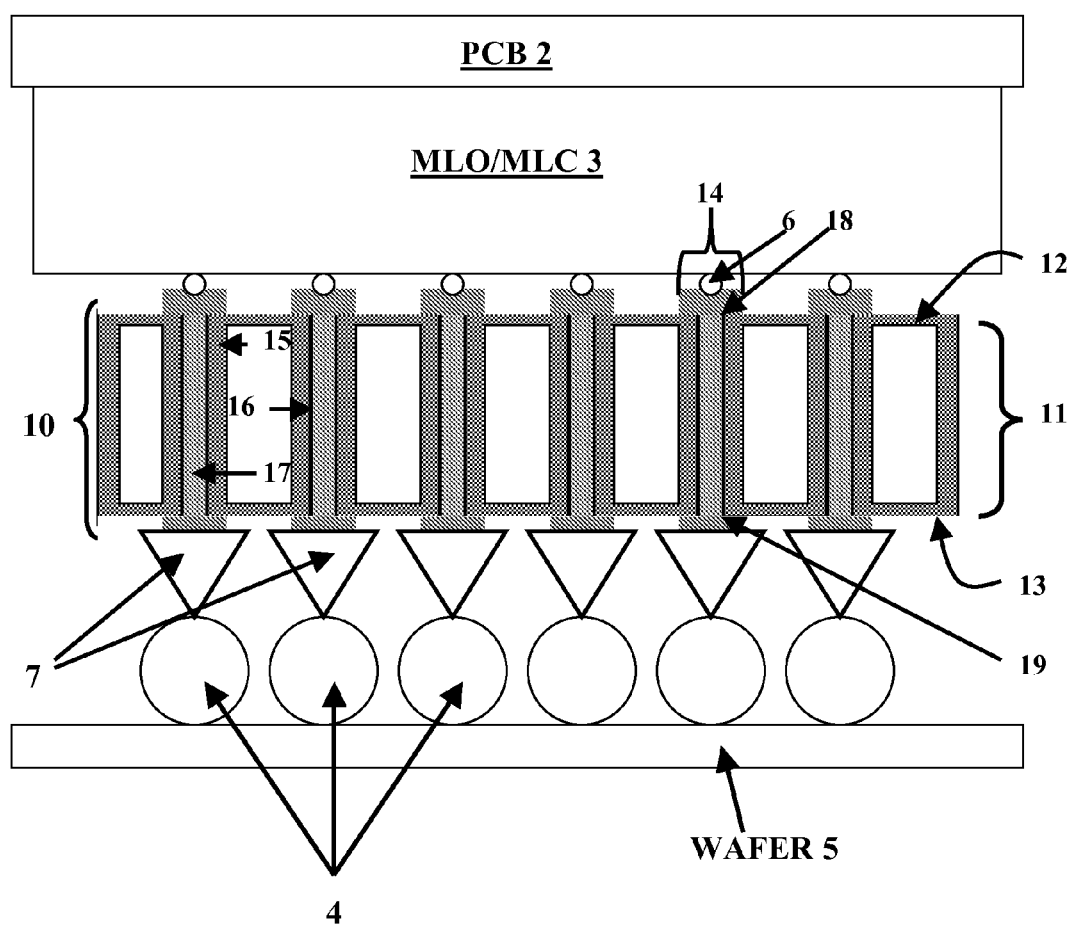
FIG. 1 is a side sectional view of a wafer-level test probe for a wafer including a silicon chicklet pedestal in accordance with an embodiment of the invention.

With reference to FIG. 1, which is not drawn to scale, a wafer-level test probe apparatus 1 for use in a wafer-level test of a wafer 5 is provided. The apparatus 1 includes a printed circuit board (PCB) 2 for a tester interface of the wafer-level test, a multi-layer ceramic (MLC) and/or organic (MLO) space transformer 3 coupled to and in signal communication with the PCB 2, and a silicon chicklet pedestal 10 interposed between the MLC/MLO 3 and the wafer 5. The silicon chicklet pedestal is coupled to and in signal communication with the MLC/MLO 3 via solder balls, such as controlled collapse connection (C4) bumps 4 and 6, and with the wafer 5 via probe tips 7 and additional solder balls, such as the C4 bumps 4 and 6.

As shown, the silicon chicklet pedestal has a main body 11, first and second opposing faces 12 and 13, and an array of vias 14 formed through the main body 11 to extend between the first and second faces 12 and 13. An insulating layer 15 is formed on sidewalls of each of the vias 14 and opposing faces 12 and 13, a conductive layer 16 is formed on the insulating layer 15, and a cured filling 17, including conductive material, is disposed in remaining space in each of the vias 14. Pairs of leads 18 and 19, respectively associated with each via 14 at the first and second faces 12 and 13, are electrically connectable to one another via the conductive layer 16 and material of the filling 17.

With this construction, the silicon chicklet pedestal may be formed with a pad width of less than 100 µm and, as such, the wafer-level test probe 1 can be employed to test a wafer 10 that has a test pitch of less than 200 µm.

With reference to FIGS. 2-16, a method of forming a silicon chicklet pedestal for use in a wafer-level test probe from a silicon wafer having first and second opposing faces is provided.

Figure 2:
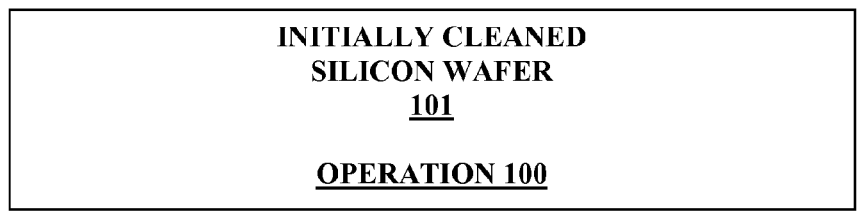
FIG. 2 is a schematic diagram illustrating a first exemplary operation of forming a silicon chicklet pedestal according to an embodiment of the invention.
Figure 3:
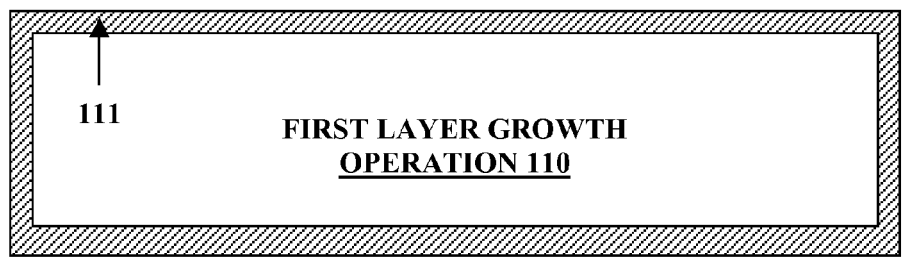
FIG. 3 is a schematic diagram illustrating a second exemplary operation of forming a silicon chicklet pedestal according to an embodiment of the invention.
Figure 4:
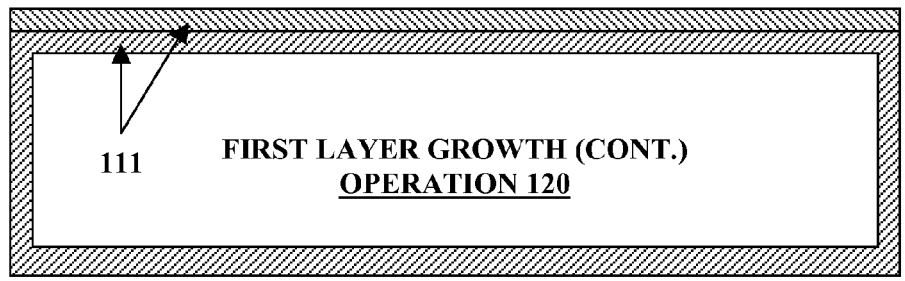
FIG. 4 is a schematic diagram illustrating a third exemplary operation of forming a silicon chicklet pedestal according to an embodiment of the invention.

As shown in FIGS. 2-4, the method initially includes cleaning the silicon wafer 101 (operation 100) in, e.g., a peroxide bath, hydrofluoric acid clean, etc., and forming a first layer 111, such as a mask layer and/or a multi-layered mask layer (hereinafter referred to as a "mask layer"), at the first and second faces (operations 110, 120). The mask layer may include a layer of various materials, such as, but not limited to oxides, nitrides and/or aluminum alloys, that can withstand etch chemistries. The mask layer may be formed by thermal growth processing (operation 110), which is carried out in, e.g., a tube furnace, and/or a combination of thermal growth processing (operation 110) and plasma enhanced chemical vapor deposition (PECVD) (operation 120) or any other suitable processing, such as sputtering. Where PECVD is employed, the mask layer is deposited generally at about 400 degrees Celsius, but can also be achieved at lower temperatures, such as about 280-350 degrees Celsius. The mask layer may be sufficiently thick so as to form a protective coating for the silicon wafer. The sufficient thickness can be about 2 or 4 µm or thicker.

Figure 5:
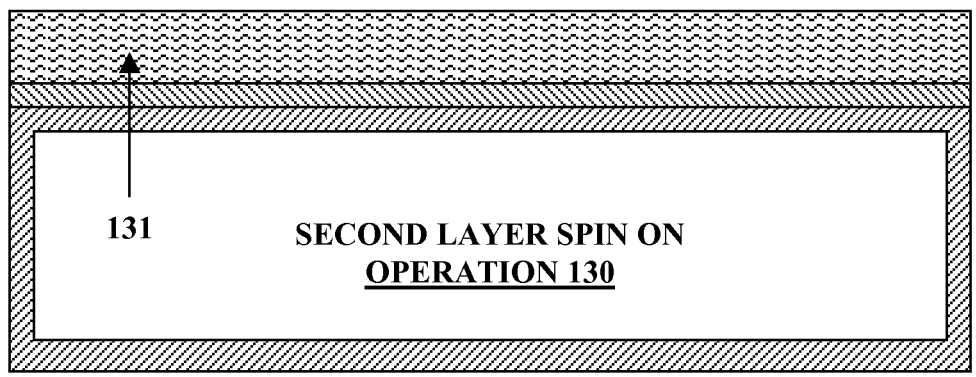
FIG. 5 is a schematic diagram illustrating a fourth exemplary operation of forming a silicon chicklet pedestal according to an embodiment of the invention.
Figure 6:
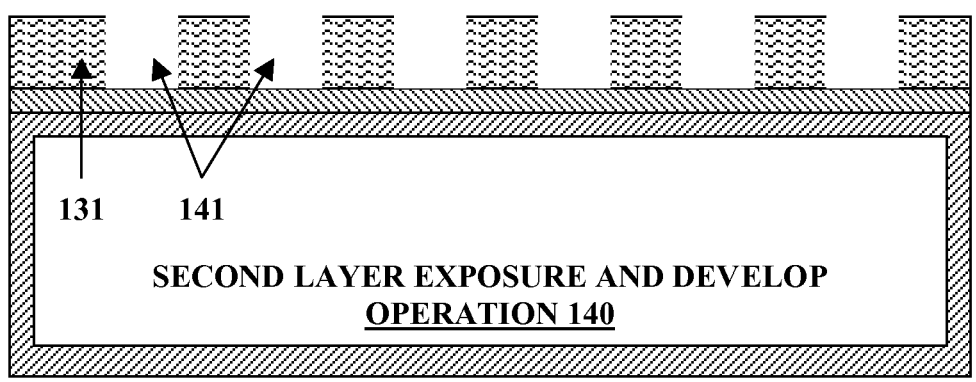
FIG. 6 is a schematic diagram illustrating a fifth exemplary operation of forming a silicon chicklet pedestal according to an embodiment of the invention.
Figure 8:
FIG. 8 is a schematic diagram illustrating a seventh exemplary operation of forming a silicon chicklet pedestal according to an embodiment of the invention.

With reference now to FIGS. 5, 6 and 8, photolithographic processing is performed to form a second layer 131, including an array of pre-vias 141, on the first layer 111 at the first face (operations 130, 140) and to form a third layer 142 on the first layer at the second face (operation 160). The second layer 131 may include a photoresist film and may be about 10 µm thick. The third layer 142 may also include photoresist film. The photolithographic processing of operations 130 and 140 is conducted in accordance with well-known methods. That is, the photoresist film of the second layer 131 is spun on the first layer 111 at the first face of the silicon wafer and is exposed according to a pattern which is reflective of a form of the array of the pre-vias 141. The exposed pattern is then developed to form the array of the pre-vias.

Here, it is noted that the forming of the third layer 142 of operation 160 may be conducted simultaneously with operations 130 and 140, subsequent to the performance of operations 130 and 140 or subsequent to the etching of the first layer 111 of operation 150, which will be described below. In fact, to the extent that tool operation is acceptable during the performance of the etching of the silicon wafer of operation 170, which will be described below, the forming of the third layer 142 of operation 160 can be skipped.

Figure 7:
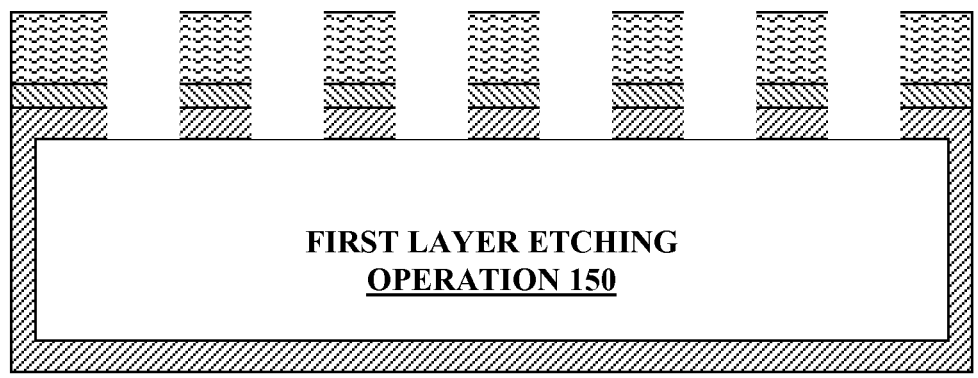
FIG. 7 is a schematic diagram illustrating a sixth exemplary operation of forming a silicon chicklet pedestal according to an embodiment of the invention.
Figure 9:
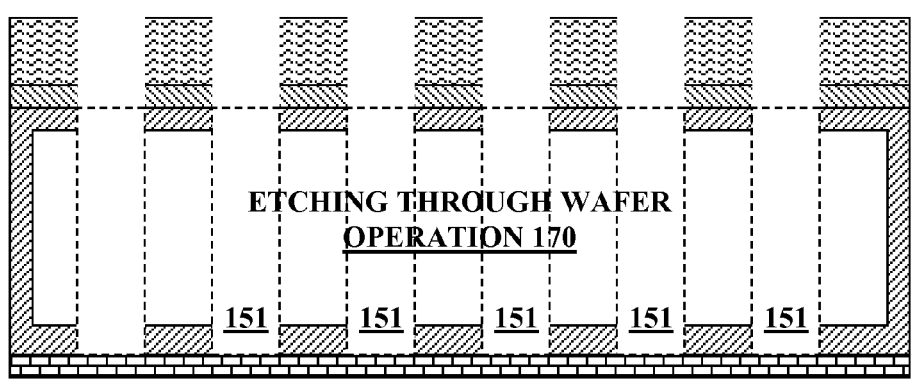
FIG. 9 is a schematic diagram illustrating an eighth exemplary operation of forming a silicon chicklet pedestal according to an embodiment of the invention.

With reference now to FIGS. 7 and 9, the method further includes etching an array of vias 151, as respective extensions of each of the pre-vias, through the first layer 111 at the first face (operation 150) and through the silicon wafer (operation 170). Here, the etching of the array of the vias 151 of operation 150 may include reactive ion etching (RIE) through the first layer 111 at the first face and, where necessary, the second face, and may further include deep reactive ion etching (DRIE) through the silicon wafer 101. The DRIE processing is particularly useful with the silicon material of the silicon wafer and allows for high aspect ratio etching. That is, the DRIE processing allows for the drilling of the vias, which may be only about 75 µm wide, through the silicon wafer, which may be up to about 1 mm thick.

Figure 10:
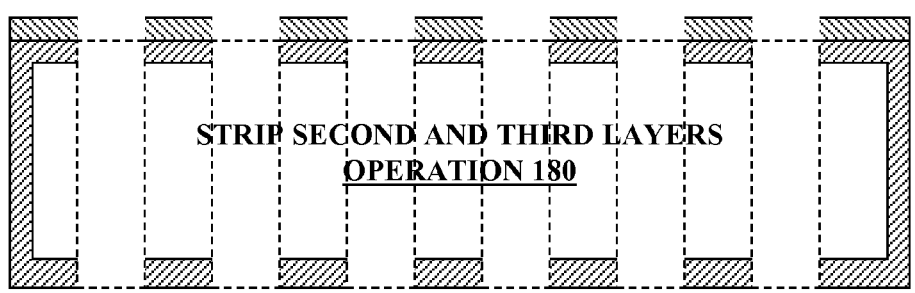
FIG. 10 is a schematic diagram illustrating a ninth exemplary operation of forming a silicon chicklet pedestal according to an embodiment of the invention.
Figure 11:
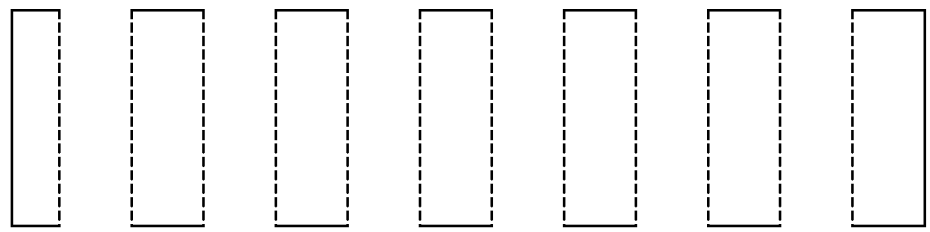
FIG. 11 is a schematic diagram illustrating a tenth exemplary operation of forming a silicon chicklet pedestal according to an embodiment of the invention.
Figure 12:
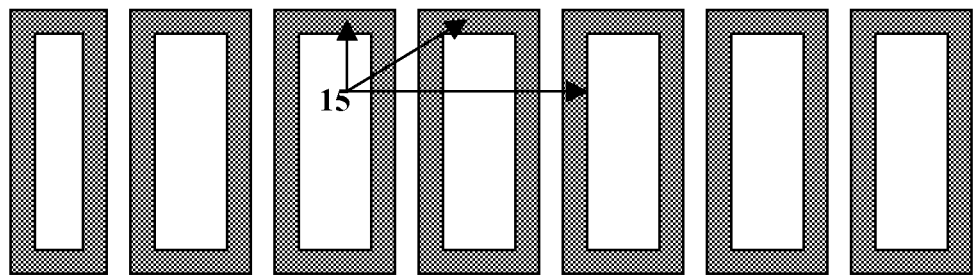
FIG. 12 is a schematic diagram illustrating an eleventh exemplary operation of forming a silicon chicklet pedestal according to an embodiment of the invention.
Figure 13:
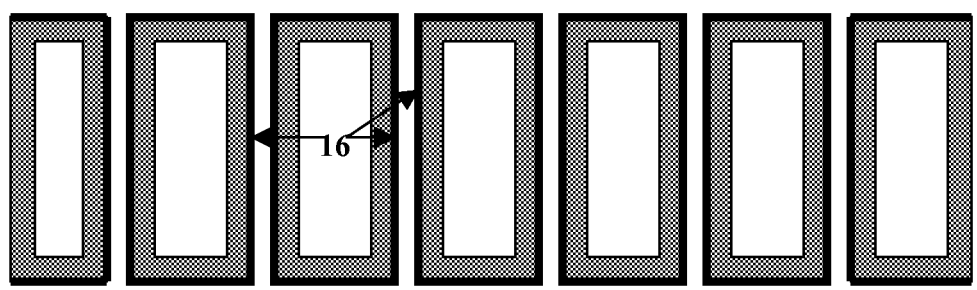
FIG. 13 is a schematic diagram illustrating a twelfth exemplary operation of forming a silicon chicklet pedestal according to an embodiment of the invention.
Figure 14:
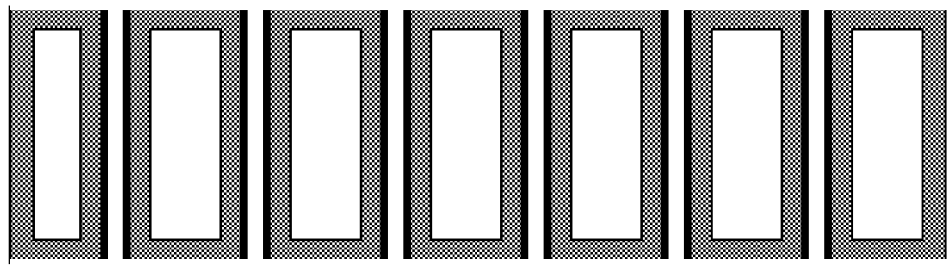
FIG. 14 is a schematic diagram illustrating a thirteenth exemplary operation of forming a silicon chicklet pedestal according to an embodiment of the invention.
Figure 15:
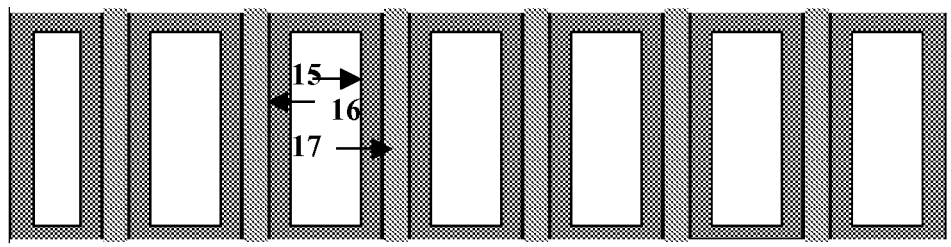
FIG. 15 is a schematic diagram illustrating a fourteenth exemplary operation of forming a silicon chicklet pedestal according to an embodiment of the invention.

With reference now to FIGS. 10 and 11, it is noted that the second and third layers 131, 142 are stripped (operation 180) by, e.g., a photoresist stripper, and that the first layer 111 is removed from the silicon wafer by, e.g., etching, wet etching, or some other suitable process for removing the first layer.

At this point, with reference to FIGS. 12-15, at least a conductive material is introduced in each of the vias. Here, the introducing of conductive material in each of the vias may include insulating sidewalls of each of the vias with the insulating layer 15 described above (operation 200), depositing a fourth layer, such as the conductive layer 16 described above, onto the insulated sidewalls (operation 210), removing a liner of the silicon wafer (operation 220), and filling remaining space in each of the vias with the filling 17 and curing the filling 17 (operation 230).

In accordance with various embodiments of the invention, the insulation used to insulate the sidewalls may include materials similar to those of the first layer 111 and, as such, the insulating of the sidewalls may include thermal growth processing and/or PECVD, as described above. The fourth layer may include a conductive layer 16 that increases conductivity through the vias and increases adhesion of the filling within the vias. As such, the fourth layer may include metallic materials, such as tantalum, titanium, tungsten, aluminum, copper and/or alloys and combinations thereof. Moreover, the fourth layer may be formed by way of any suitable application process, such as, for example, metal sputtering. The liner removal from the first and second faces 12 and 13 may include chemical-mechanical polishing (CMP) processing. Finally, the filling 17 may include a material selected from the group consisting of silver epoxy paste, electroplated metal, electroless-plated metal, injected solder and injection molded solder. Where possible, the filling may be injected into the vias and cured by way of heating and/or ultraviolet (UV) radiation.

Figure 16:
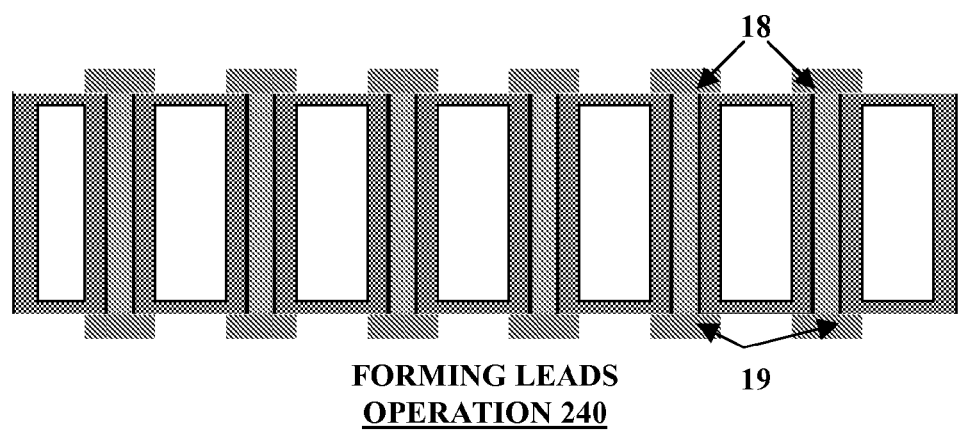
FIG. 16 is a schematic diagram illustrating a fifteenth exemplary operation of forming a silicon chicklet pedestal according to an embodiment of the invention.

With reference to FIG. 16, a pair of leads 18 and 19 are formed (operation 240) for each of the vias at the first and second faces. The leads 18 and 19 of each pair are electrically connectable via the conductive material of the corresponding via. In more detail, with reference to FIG. 1, the leads 18 on the first face 12 of the silicon chicklet pedestal 10 (i.e., the ball limiting metallurgy (BLM) side), are formed to be electrically coupled and/or connectable to the solder balls, such as the C4 bumps 6, deposited thereon, which are themselves coupled and/or connected to the MLC/MLO 3. Conversely, the leads 19 on the second face of the silicon chicklet pedestal 10 (i.e., the top surface metallization (TSM) side), are formed to be electrically coupled to and/or connectable to the C4 bumps 4.

In accordance with the above-described apparatus 1 and methods, it is seen that a silicon chicklet pedestal 10 allow a test probe to achieve increasing pitch footprints of 3-on-6 (75 µm on 150 µm pitch), 2-on-4 (50 µm on 100 µm pitch) and/or 1-on-2 (25 µm on 50 µm pitch). Furthermore, the test probe will be cheaper to fabricate, will have a faster manufacturing turnaround, will have the ability to be assembled to organic substrates as they become more available in the future.

While the disclosure has been described with reference to exemplary embodiments, it will be understood by those skilled in the art that various changes may be made and equivalents may be substituted for elements thereof without departing from the scope of the disclosure. In addition, many modifications may be made to adapt a particular situation or material to the teachings of the disclosure without departing from the essential scope thereof. Therefore, it is intended that the disclosure not be limited to the particular exemplary embodiment disclosed as the best mode contemplated for carrying out this disclosure, but that the disclosure will include all embodiments falling within the scope of the appended claims.

What is claimed is:

1. An apparatus for use in a wafer-level test of a wafer, comprising:
   a printed circuit board (PCB) for a tester interface of the wafer-level test;
   a multi-layer ceramic and/or organic space transformer coupled to and in signal communication with the PCB; and
   a silicon chicklet pedestal, comprising:
      a silicon wafer having first and second opposing faces and a main body through which an array of vias each extend between the first and the second faces;
      an insulating layer formed on sidewalls of each of the vias;
      a conductive layer formed on the insulating layer;
      a cured filling, including conductive material, disposed in remaining spaces in each of the vias; and
      a pair of leads associated with each of the vias at the first and second faces, the leads of each pair being electrically connectable by the conductive material of the associated via
   wherein the silicon chicklet pedestal is interposed between and coupled to the multi-layer ceramic and/or organic space transformer and the wafer at the first and second faces, respectively.

2. The apparatus according to claim 1, wherein the silicon chicklet pedestal is coupled to the multi-layer ceramic and/or organic space transformer via controlled collapse connection (C4) bumps.

3. The apparatus according to claim 1, wherein the silicon chicklet pedestal is coupled to the wafer via controlled collapse connection (C4) bumps.

4. The apparatus according to claim 1, wherein the wafer has a test pitch of less than 200 µm and the silicon chicklet has a pad width of less than 100 µm.

5. The apparatus according to claim 1, wherein the conductive layer coats interior facing surfaces of the insulating layer.

6. The apparatus according to claim 1, wherein the insulating layer comprises one or more of oxides, nitrides and/or aluminum alloys.

7. The apparatus according to claim 1, wherein the conductive layer comprises one or more of tantalum, titanium, tungsten, aluminum, copper and/or alloys and combinations thereof.

8. The apparatus according to claim 1, wherein the cured filling comprises a material selected from the group consisting of silver epoxy paste, electroplated metal, electroless-plated metal, injected solder and injection molded solder.

9. The apparatus according to claim 1, wherein the cured filling is curable by heat and/or ultraviolet (UV) radiation.

10. The apparatus according to claim 1, wherein the leads are electrically coupled and/or connectable to solder balls.

* * * * *